United States Patent
Bernier et al.

(10) Patent No.: US 6,674,148 B1
(45) Date of Patent: Jan. 6, 2004

(54) LATERAL COMPONENTS IN POWER SEMICONDUCTOR DEVICES

(75) Inventors: Eric Bernier, Mettray (FR); Jean-Michel Simonnet, Tours (FR)

(73) Assignee: SGS-Thomson Microelectronics S.A., Saint Genis (FR)

(*) Notice: Subject to any disclaimer, the term of this patent is extended or adjusted under 35 U.S.C. 154(b) by 0 days.

(21) Appl. No.: 09/428,013

(22) Filed: Oct. 27, 1999

Related U.S. Application Data

(62) Division of application No. 08/787,741, filed on Jan. 24, 1997, now Pat. No. 5,994,171.

(30) Foreign Application Priority Data

Jan. 26, 1996 (FR) .......................................... 96 01179

(51) Int. Cl.[7] .............................................. H01L 31/11
(52) U.S. Cl. .................... 257/584; 257/587; 257/593; 257/526; 257/557; 257/511; 257/512
(58) Field of Search .............................. 438/622, 139; 257/584, 593, 511, 512, 336, 341, 714

(56) References Cited

U.S. PATENT DOCUMENTS

| | | | |
|---|---|---|---|
| 3,699,406 A | 10/1972 | Mapother et al. | 317/235 R |
| 4,896,196 A | 1/1990 | Blanchard et al. | 357/23.4 |
| 4,982,245 A | 1/1991 | Hanaoka et al. | 357/15 |
| 5,808,326 A | 9/1998 | Bernier et al. | 257/109 |
| 5,841,197 A | 11/1998 | Adamic, Jr. | 157/777 |
| 6,051,862 A | * 4/2000 | Grimaldi | 257/341 |

OTHER PUBLICATIONS

Current– Gain Enhancemnt in Lateral p–n–p Transistors by an Optimized Gap in the n+Buried Layer K. N. Bhat and M. K. Achuthan IEEE Transactions on Electron Devices. VOL. ED–24, No. 3, Mar. 1997.*
French Search Report from French Patent Application 96 01179, filed Jan. 26, 1996.
IEEE Transactions on Electron Devices, vol. 24, No. 3, Mar. 1977, New York, US, pp 205–214, K.N. Bhat and M.K. Achuthan, "Current–Gain Enhancement in Lateral p–n–p Transistors by Optimized Gap in the n+ Buried Layer".
Patent Abstracts of Japan, vol. 002, No. 029 (E–017), Feb. 23, 1978 & JP–A–52 150984 (Mitsubishi Electric Corp.).
Patent Abstracts of Japan, vol. 001, No. 019 (E–004), Mar. 24, 1977 & JP–A–51 116685 (Fujitsu Ltd.).

* cited by examiner

*Primary Examiner*—Nathan J. Flynn
*Assistant Examiner*—André C Stevenson
(74) *Attorney, Agent, or Firm*—Wolf, Greenfield & Sacks, P.C.

(57) ABSTRACT

A method for adjusting the gain or the sensitivity of a lateral component formed in the front surface of a semiconductor wafer, having a first conductivity type, includes not doping or overdoping, according to the first conductivity type, the back surface when it is desired to reduce the gain or sensitivity of the lateral component, and doping according to the second conductivity type, the back surface, when the gain or the sensitivity of the lateral component is to be increased.

11 Claims, 2 Drawing Sheets

US 6,674,148 B1

LATERAL COMPONENTS IN POWER SEMICONDUCTOR DEVICES

This application is a division of Ser. No. 08/787,741 filed Jan. 24, 1997 U.S. Pat. No. 5,994,171.

BACKGROUND OF THE INVENTION

1. Field of the Invention

The present invention relates to monolithic power semiconductor devices and more particularly to the optimization of lateral components in such power semiconductor devices.

2. Discussion of the Related Art

Generally, semiconductor devices, designed to conduct high currents and to withstand high voltages, are vertically disposed on silicon wafers. A specific example is illustrated in FIG. 1 which is a schematic cross-sectional view of a thyristor. The component is fabricated from a silicon wafer having a thickness ranging from 0.2 mm to 0.4 mm and made of a very low doped single-crystal semiconductor (usually $10^{14}$ to $10^{16}$ atoms/cm$^3$). A main electrode of the thyristor is formed on the upper or front surface of the wafer and the other main electrode is formed on the lower surface. In the represented example, substrate N1 corresponds to an N-type silicon wafer. The lower surface, or back surface, has a P-type diffusion P2 and, in the front surface, is formed a P-type region P3 in which an N-type region N4 is diffused. A cathode metallization K contacts region N4 and a gate metallization G contacts region P3. The remaining thickness of the substrate N1 between its interfaces with regions P2 and P3 determines, in particular, the breakdown voltage of the component. In this type of vertical structure, insulation walls 3 and 4 respectively formed from the upper and lower surfaces and contacting each other to delineate a portion of substrate N1, are frequently provided.

A plurality of types of vertical power components are known, for example thyristors, triacs, power transistors, power MOS transistors and various alternatives of these components with a direct or indirect control and possibly with a voltage-control (control through MOS transistor). Generally, all these components are characterized by a vertical structure, along the thickness of a wafer, and by the fact that at least one of their constitutive layers corresponds to a thick portion of the low doped substrate. In addition, over the last years, numerous improvements have been achieved for doping the back surfaces of wafers and various diffusions are commonly formed in the back surface. It is also known that a portion of the back surface can be insulated from the back surface metallization.

In some cases, it is further desired to form lateral components in power devices.

FIG. 2 represents an example of such a component, which is a PNP transistor formed in the upper or front surface of substrate N1 and including a P-type emitter region P5, a P-type collector region P6 and an N-type base contact region N7. As for a vertical component, if it is desired that the breakdown voltage of this component be high, the lateral space between regions P5 and P6 should be large, substantially equal to the vertical thickness of layer N1 represented in FIG. 1.

FIG. 3 represents an exemplary lateral transistor formed in the upper surface of substrate N1 and including a P-type anode region P10, a P-type cathode-gate region P and an N-type cathode region N12 which is formed in region P11. A region N13 has a stop-channel function. Here again, if it is desired that the breakdown voltage be high, the lateral space between regions P10 and P11 should be large, substantially equal to the vertical thickness of layer N1 represented in FIG. 1.

Generally, it is desired to provide transistors with a relatively high gain and/or relatively sensitive lateral thyristors, i.e., the transistors which form the thyristors should have a relatively high gain. This is a priori difficult because of the large distance between the P regions necessary to obtain a high breakdown voltage. In order to increase the gain, the doping and the deepness of regions P5, P6, P10 and P11, as well as the location of the various regions (ring or digited structures) are optimized. However, it is difficult to obtain satisfying solutions and, even when possible, this requires fabrication of some layers with specific doping levels and patterns, which causes that these layers can no longer be realized at the same time as other layers fabricated in the same semiconductor device for other components of the device.

Another lateral component is represented in FIG. 4A and corresponds to the series connection of two diodes, as represented in FIG. 4B, which are formed on the front side of a substrate N1. The first diode is formed by the junction between a P-type region P20 and an N-type region N21 formed in region P20. The first diode includes a metallization A1 contacting region N21 and a metallization B1 contacting region P20, generally with interposition of a highly doped P-type region P22. Likewise, the second diode includes a region P24, a region N25 and a region P26 which are arranged as represented in FIG. 4A. Region N25 contacts the same metallization B1 as region P22 and region P26 contacts metallization C1.

FIGS. 5A and 5B are identical to FIGS. 4A and 4B with the difference that, in FIG. 5A, the device is formed from a P-type substrate instead of an N-type substrate.

A drawback of the structures of FIGS. 4A and 5A is that parasitic thyristors may be triggered, such as the thyristor formed by regions N21-P20-N1-P24 or other parasitic thyristors liable to exist between various series of diodes formed in the same substrate, for example to form a monolithic rectifying bridge. In this case, in contrast to the case represented in FIG. 3, it is desired to reduce as much as possible the sensitivity of the parasitic thyristors, i.e., the gain of the bipolar transistors which form the thyristors. Metal diffusions (gold, platinum) or electron or proton irradiations are used. However, this increases the complexity of the fabrication process; in addition, the effects of such processes are difficult to accurately localize.

All the known methods to adjust the sensitivity or the gain have, as indicated above, the drawback of not optimally providing the desired result, and the drawback of requiring additional fabrication steps with respect to the usual fabrication steps of a power semiconductor device.

SUMMARY OF THE INVENTION

An object of the present invention is to optimize the gain or sensitivity of desired or parasitic lateral components to be able to select a high gain in the case of desired components or a low gain in the case of parasitic components without the need for other fabrication steps than those currently used to fabricate a power semiconductor device.

To achieve this and other objects, the present invention provides a method for adjusting the gain or the sensitivity of a lateral component formed in the upper surface of a semiconductor wafer of a first conductivity type, including the steps of not doping or highly doping according to the first conductivity type, the back surface when it is desired to reduce the gain or sensitivity of the lateral component, and doping according to the second conductivity type, the back surface when it is desired to increase the gain or the sensitivity of the lateral component.

According to an embodiment of the present invention, the diffusion of the first conductivity type of the back surface is increased with the desired decrease of the gain.

According to an embodiment of the present invention, the diffusion of the second conductivity type of the back surface is increased with the desired increase of the gain.

The present invention also achieves a lateral transistor or thyristor formed in the front surface of a low doped semiconductor wafer of a first conductivity type including on the back surface of the wafer a layer of the second conductivity type.

According to an embodiment of the present invention, the layer of the second conductivity type extends substantially through one half of the substrate thickness and is formed at the same time as lateral diffusion walls formed from the back surface.

The present invention also achieves a set of PN junction diodes formed on the front surface of a low doped semiconductor wafer of a first conductivity type, in which the back surface of the substrate includes a highly doped region of the first conductivity type.

The foregoing and other objects, features, aspects and advantages of the invention will become apparent from the following detailed description of the present invention when taken in conjunction with the accompanying drawings.

As conventional in the field of the representation of semiconductor components, the cross-sectional views of the components are not drawn to scale and their horizontal or vertical sizes are arbitrarily enlarged or reduced to simplify the representation and to improve the understanding.

The present invention is based on experiments and observations made by the applicant.

Usually, as explained with relation to FIGS. 2–5, when considering a lateral component formed in a power device, one concentrates on the diffusions achieved in the front surface of the component and neglects what occurs on the back surface because the latter is separated from the front surface diffusions by a thick substrate. However, the applicant conducted a series of experiments on the influence of back surface diffusions achieved opposite a considered component.

Figure 6:
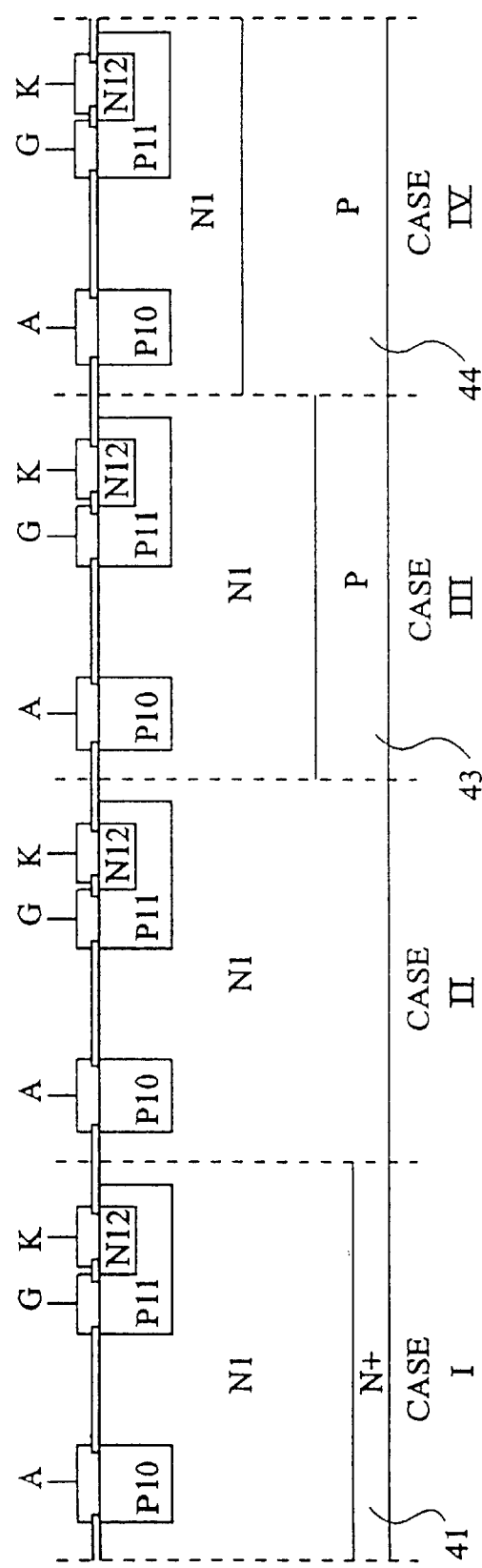
FIG. 6 illustrates the method according to the present invention for adjusting the gain or sensitivity of a lateral component.

FIG. 6 summarizes the result of these experiments in the case where the considered lateral component is a lateral thyristor. FIG. 6 represents a same lateral thyristor including a P-type anode region P10 and a P-type cathode-gate region P11 formed in a low doped N-type substrate N1, an N-type cathode region N12 being formed in region P11. The applicant has studied the sensitivity of the thyristor when the back surface of the substrate included an N-type highly doped region 41 (case I), when the back surface included no diffusion (case II), when the back surface included a P-type region 43 having a depth substantially equal to that of the P diffusions formed from the upper surface (case III), and when the back surface included a P-type region 44 corresponding to the diffusion of an insulating wall formed from the back surface (case IV).

It was observed that the sensitivity of the thyristors increases from case I to case IV. It will be noted that the back surface is not biased at a particular level. The back surface is coated either with an insulating layer or with a grounded metallization.

Figure 2:
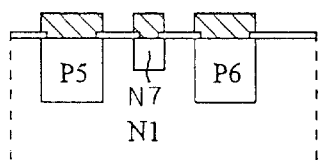
Figure 3:
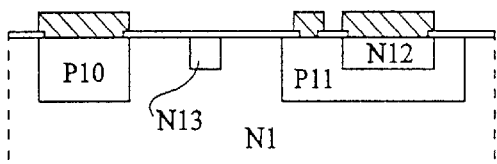
Figure 4A:
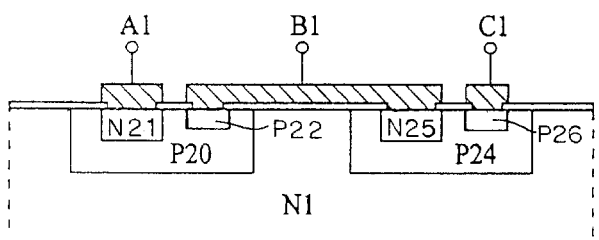
Figure 4B:
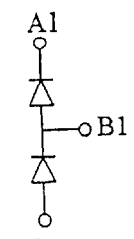
Figure 5A:
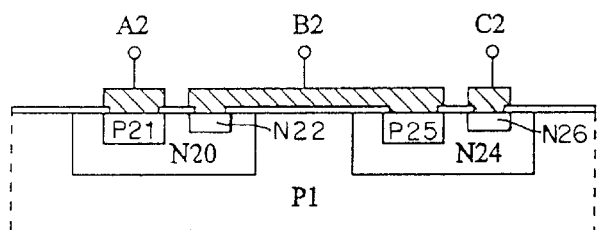
Figure 5B:
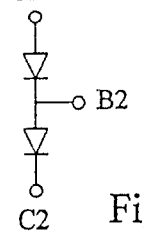

Similarly, the gain of lateral transistors, such as the one illustrated in FIG. 2 increases from case I to case IV.

Although the applicant does not intend to give a theoretical explanation of the observed phenomenon, this phenomenon could be attributed to the behavior of the portion of charges which are emitted by region P10 (or P5) downward in the substrate. In cases I and II, the charges would recombine in the highly doped N-type region 41 or at the back surface, respectively. These charges could therefore not be collected by region P11 (or P6). In contrast, in cases III and IV, the layer having a conductivity inverted with respect to that of the substrate would act like a charge mirror. The charges emitted downward would finally be collected by region P11 (or P6). The better collection of the charges provides an increased gain (transistor) or sensitivity (thyristor). The effect of recombination of the charges would be amplified when a region 41 having the same conductivity as the substrate is close to the diffusions of the back surface and the mirror effect would increase when a region 43 or 44 having a conductivity inverted with respect to that of the substrate is closer to the diffusions of the upper surface (or is more highly doped).

Thus, a method to adjust the gain of a lateral transistor or the sensitivity or a lateral thyristor by acting on the diffusions of the back surface of a power device is obtained.

More particularly, to obtain a very sensitive lateral thyristor, one of the configurations of the case III or IV will be selected. To avoid the influence of parasitic lateral thyristors (case of FIGS. 4 or 5), case I or II will be used. For example, in the case of FIG. 4A, an $N^+$-type diffusion on the back surface will be achieved to inhibit the gain of lateral thyristors and, in FIG. 5A, a $P^+$-type diffusion will be achieved.

Figure 1:
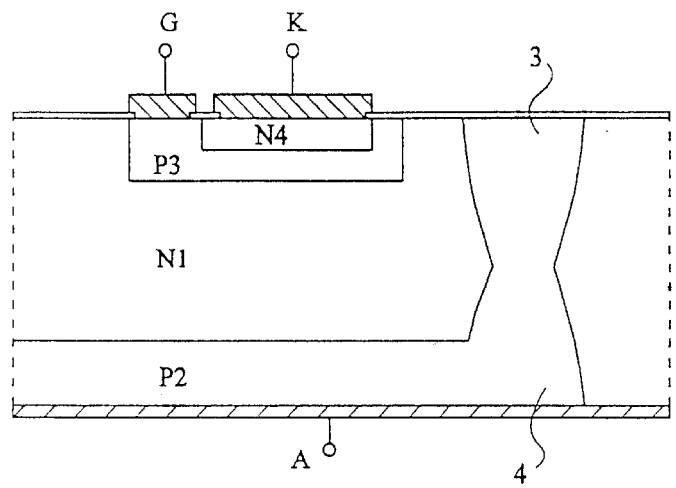
FIGS. 1–5, above described, illustrate the problem to be solved and the state of the art.

This could require a modification of existing structures. Especially, in structures including vertical thyristors such as the thyristor of FIG. 1, in which the whole back surface normally includes a P-type diffusion, the P-type diffusion will be stopped opposite the regions including components where the occurrence of parasitic thyristors, such as those of FIGS. 4 and 5, should be avoided. Also, preferably, a deeper P-type region should be achieved opposite components like those of FIGS. 2 and 3 in which the gain or sensitivity should be increased.

In practice, the implementation of the invention does not significantly increase the complexity of the conventional methods for fabricating power components. Care should only be taken, according to the desired result, to mask or not portions of the back surface located opposite lateral components before performing diffusion operations in the front surface of the wafer.

The present invention generally applies to the adjustment of the gain or sensitivity of lateral components formed on a surface of a semiconductor wafer. The lateral components can be of any known type and can include various conventional fabrication alternatives. As regards the decrease of the gain or sensitivity of parasitic components, it should be remarked that the parasitic components can be thyristors, as well as transistors, triacs, and so on.

As is apparent to those skilled in the art, various modifications can be made to the above disclosed preferred embodiments; more particularly, in each considered example, all the conductivity types can be inverted.

Having thus described at least one illustrative embodiment of the invention, various alterations, modifications and improvements will readily occur to those skilled in the art. Such alterations, modifications, and improvements are intended to be within the spirit and scope of the invention. Accordingly, the foregoing description is by way of example only and is not intended to be limiting. The invention is limited only as defined in the following claims and the equivalents thereto.

What is claimed is:

1. A lateral transistor or thyristor formed in a front surface of a low doped semiconductor substrate of a first conductivity type including, on a back surface of the substrate, a layer of a second conductivity type, wherein the layer of the second conductivity type increases the gain of the lateral transistor or thyristor.

2. The lateral transistor or thyristor of claim 1, wherein the layer of the second conductivity type extends substantially through one half of the substrate thickness and is formed at the same time as lateral diffusion walls formed from the back surface.

3. A set of PN junction diodes that forms a transistor in a front surface of a semiconductor substrate of a first conductivity type, wherein a back surface of the substrate includes a highly doped region of the first conductivity type that decreases the gain of the transistor.

4. A semiconductor structure comprising:
   a substrate of a first conductivity type; and
   a doped region of a second conductivity type formed at a back surface of the substrate,
   wherein a lateral component is formed at a front surface of the semiconductor structure and the doped region increases the gain of the lateral component.

5. The semiconductor structure of claim 4, wherein the lateral component is formed at the front surface of the substrate.

6. The semiconductor structure of claim 4, wherein the lateral component comprises a transistor.

7. A semiconductor structure comprising:
   a substrate of a first conductivity type; and
   a doped region of a second conductivity type formed at a back surface of the substrate, the doped region extending substantially through one half of the substrate thickness,
   wherein a lateral component is formed at a front surface of the semiconductor structure.

8. A semiconductor structure comprising:
   a substrate of a first conductivity type; and
   a doped region of a second conductivity type formed at a back surface of the substrate, the doped region extending to a depth substantially equal to the depth of an insulating wall that extends from the back surface,
   wherein a lateral component is formed at a front surface of the semiconductor structure.

9. The semiconductor structure of claim 4, wherein the layer component comprises a thyristor.

10. The semiconductor structure of claim 4, wherein the substrate is a low-doped substrate.

11. A semiconductor structure comprising:
    an n-type substrate; and
    a p-type doped region formed at a back surface of the substrate,
    wherein a lateral component is formed at a front surface of the semiconductor structure.

* * * * *